United States Patent [19]
Brundle et al.

[11] 4,218,663
[45] Aug. 19, 1980

[54] WAVEGUIDE POWER LIMITER

[75] Inventors: Leonard K. Brundle, Haywards Heath; Stuart R. Longley, Oxted; Michael D. Coleman, Reigate, all of England

[73] Assignee: U.S. Philips Corporation, New York, N.Y.

[21] Appl. No.: 886,134

[22] Filed: Mar. 13, 1978

[30] Foreign Application Priority Data

Mar. 16, 1977 [GB] United Kingdom ............... 11103/77

[51] Int. Cl.² .......................... H01P 1/22; H01P 1/34
[52] U.S. Cl. .................................... 333/17 L; 333/251
[58] Field of Search .................... 333/17 L, 24.1, 24.2

[56] References Cited

U.S. PATENT DOCUMENTS

| 3,010,084 | 11/1961 | Seidel | 333/24.2 |
| 3,035,235 | 5/1962 | Kostelnick | 333/24.2 |
| 3,332,042 | 7/1967 | Parris | 333/24.1 X |
| 3,333,214 | 7/1967 | Parris | 333/24.2 X |
| 3,555,463 | 1/1971 | Ogasawara et al. | 333/24.1 X |

Primary Examiner—Paul L. Gensler
Attorney, Agent, or Firm—Algy Tamoshunas

[57] ABSTRACT

A waveguide power limiter comprising a ferrite slab provided with one or more cavities containing dielectric inserts. The slab is positioned in a waveguide and the cavities may be graded so that different portions of the slab have different power limiting ranges.

15 Claims, 12 Drawing Figures

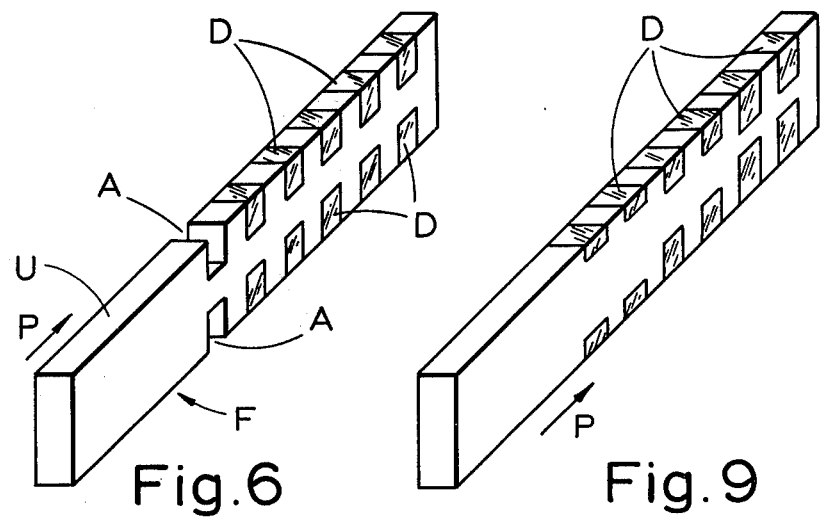
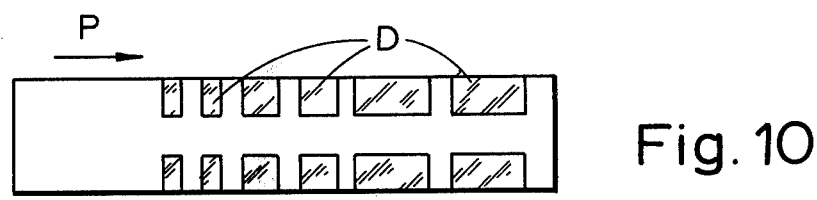
Fig. 10
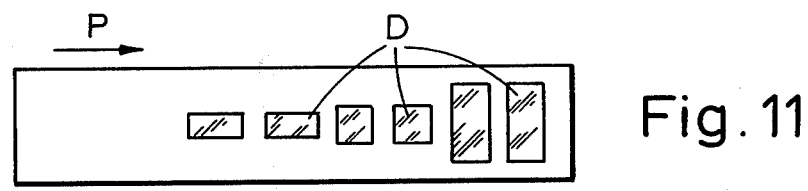
Fig. 11
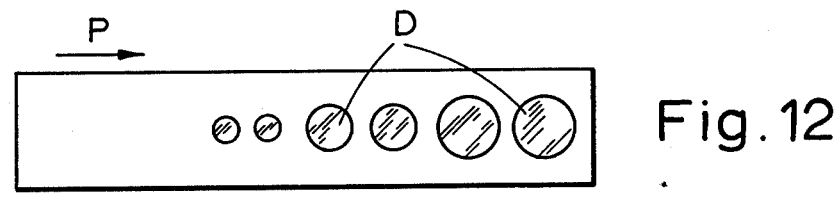
Fig. 12

WAVEGUIDE POWER LIMITER

This invention relates to a microwave power limiter of the kind comprising a rectangular waveguide section having opposed wide walls and opposed narrow walls and having an input port at one end and an output port at the other end and also having ferrite material and dielectric material within the waveguide section and disposed against one of the narrow walls. Such a limiter can be used, for example, instead of or in addition to a T-R cell, to protect a receiver in a transmitter-receiver arrangement using a single antenna system.

Such an arrangement is disclosed in U.S. Pat. No. 3,629,735. This patent discloses an arrangement in which ferrite and dielectric rods of rectangular cross-section are aligned along and adjacent to the narrow wall of a rectangular waveguide, a magnetic bias field being applied parallel to the narrow waveguide wall so as to permeate the ferrite and dielectric rod structure to provide a condition of subsidiary resonance. In fact, the sole disclosure of this patent of ferrite material it that of YIG.

This prior art has several disadvantages, one of the biggest of which is that it is very difficult to align a number of small pieces of material, that is to say the YIG and the dielectric, and to position them correctly within the waveguide. In order to assist heat dissipation from the ferrite and dielectric device, it is desirable that the device is in good contact with the walls of the waveguide throughout its length; however, this is not easy when the device is a plurality of loose pieces and it is very time consuming and costly to have to assemble such pieces by cementing them together and then, probably, carrying out a further cutting or grinding operation to ensure that they fit within the waveguide. In this respect it would seem that these difficulties were already appreciated in the above-mentioned patent since it refers to placing the ferrite and dielectric rods adjacent to the side wall of a waveguide instead of pressing them closely against it.

The present invention provides an improved design with comparable or improved performance which is easier to fit inside the waveguide and which obviates the above-mentioned disadvantages which lead to a high cost and difficulty of manufacture.

According to the present invention, a microwave power limiter comprising a rectangular waveguide section having opposed wide walls and opposed narrow walls with an input port at one end and an output port at the other end and also having ferrite material and dielectric material positioned within the waveguide section against one of the narrow walls. The ferrite material is in the form of a monolithic slab having apertures which accommodate inserts of a dielectric non-magnetic material. Such a construction of a ferrite and dielectric material is much less difficult to make and to fit within a waveguide than are constructions previously proposed and this in turn leads to a significant and useful reduction in cost of the device as a whole. Further, quantity production of devices is facilitated and, when produced in quantities, the variation from device to device can be made much less because of the possibility of forming the apertures by machine so that there is hardly any variation from one device to the next.

If desired, the inserts may be cut from cylindrical rods of a suitable material and inserted in apertures in the block of ferrite. To this end, in one embodiment of the invention the apertures and inserts are of circular cross-section.

Alternatively the dielectric may be sections cut from a dielectric rod of rectangular cross-section. In that case, the apertures and inserts are of rectangular cross-section.

The apertures may run along the centre of the slab or may be in the edges of the slab so that in yet a further alternative arrangement the ferrite slab has a notched edge which accommodates dielectric inserts of the same cross-section as the notches so as to fit therein.

The insertion of the dielectric inserts in the ferrite material may be considerably facilitated if, instead of cutting the inserts from solid material and fitting them into the apertures in the ferrite slab, a castable dielectric material is used. The apertures in the slab may then be of any convenient shape of size since they can readily be filled with the hardenable, castable dielectric material.

In order to reduce higher order modes of propagation, a further feature of the invention is that in one or more of the apertures, a wall surface which is parallel to the direction of power flow is metallised.

It has been found possible, when making a limiter embodying the invention, to so arrange the dielectric and ferrite that different portions of the ferrite/dielectric material exhibit limiting phenomena at different power levels. This leads to the outstanding advantage that the dynamic range over which power can be limited is considerably extended without having to use a series of individual, separate power limiters each having only a restricted dynamic range. According, therefore, to a further feature of the invention the ferrite material is in the form of a monolithic slab comprising two portions shaped to act as power-absorbers at different power levels. One of the portions is at the end of the slab nearer the input and is operative to absorb power at a higher power level and the other portion is at the end of the slab nearer to the output port and is operative to absorb power at a lower power level.

It is apparent that more than two portions may be incorporated in a single slab. For example, the slab may comprise a third portion intermediate the other two portions and operative to absorb power at an intermediate power level.

Embodiments of the invention will now be described with reference to the diagrammatic drawings in which:

FIGS. 4, 5 and 6 illustrate different embodiments of the invention,

FIGS. 9, 10, 11 and 12 illustrate further embodiments of the invention.

In the drawings, like parts in the various Figures are indicated by the same references.

Figure 1:
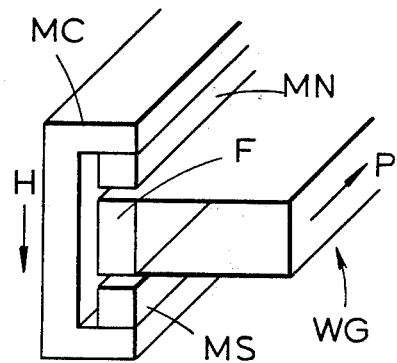
FIG. 1 illustrates the general arrangement of a power-limiter.

Referring now to FIG. 1 this illustrates a waveguide WG within which is disposed a ferrite or composite dielectric/ferrite device F which is positioned against one of the narrow walls of the guide. The device F is immersed in a magnetic biasing field extending, in a direction indicated by arrow H, across the gap between a permanent magnetic member MN having a north pole on its lower face as viewed in the Figure and a permanent magnetic member MS having a south pole on its upper face. The magnetic circuit is completed by a soft-magnetic member MC. Power flows along the waveguide in the direction of the arrow P.

Figure 2:
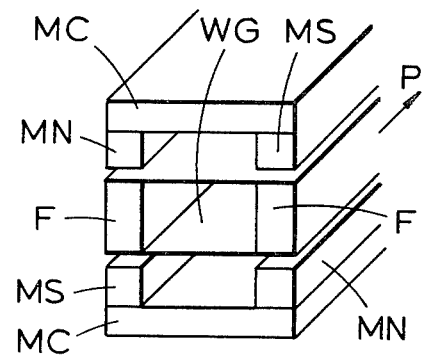
FIG. 2 illustrates another arrangement of a limiter.

FIG. 2 shows an arrangement where the waveguide has within it two devices F. At each side of the waveguide the device is immersed in a magnetic field provided in this case by two sets of permanent magnet members MN and MS, direction of the magnetic field being of course different in each of the two devices. In this Example the magnetic circuit is completed by two soft-magnet members MC. It will of course be understood that other methods of applying a magnetic field to the ferrite member can be used.

When securing a device of this kind inside a waveguide it is necessary for the member to be fitted fairly snugly and closely inside the guide.

Figure 3:
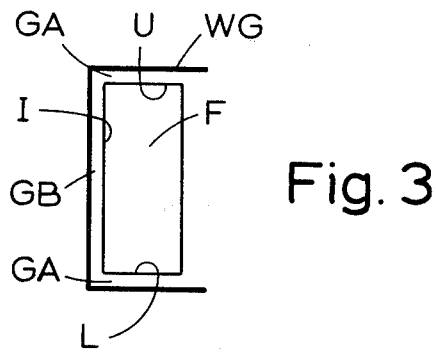
FIG. 3 illustrates certain undesirable characteristics of a limiter.

Referring now to FIG. 3 this shows, to a somewhat exaggerated scale, a ferrite device F secured adjacent one narrow wall of a waveguide WG with gaps GA between the upper face U of the ferrite and the facing portion of the wide wall of the waveguide and between the lower face L of the device and the adjacent facing wall of the guide. Also, a gap GB is shown between the inner face I of the device and the narrow wall of the guide.

Considering first the space GB, this means that because the device F is not in close contact with the narrow wall of the guide, thermal transmission from the ferrite of the device, in which the energy is absorbed, to the guide is very substantially decreased so that the heat-sink effect of the metal guide tends to be lost and at high power levels the ferrite becomes undesirably hot.

The gaps GA at the upper and lower faces of the device will have a dielectric constant of unity while that of the ferrite or of the dielectric as the case may be will be for example between about 6 and 17 so that the electric field strength in the gaps could be some 6 to 17 times that in the ferrite or the dielectric: this may cause spark-over between the wide wall of the guide and the device.

It will of course be understood that because of the presence of the ferrite and the magnetic biasing field, the electric field strength across the guide is distorted and attains within the region of the device a much higher density than it would in the case of a normal guide in which no magnetised gyromagnetic ferrite is present. It is therefore necessary to take suitable precautions to ensure that the device fits closely within the waveguide so as to avoid the disadvantages attendant upon the presence of these air gaps and it is this operation that tends to be difficult when the device itself is composed of a number of smaller pieces even when those smaller pieces are cemented together in an endeavour to construct a single block of material that can be ground to close tolerances so as to achieve the required fit. As will be described later this necessity for a close tolerance can be avoided by one of the features which are embodied in the invention, thus reducing very significantly the cost and the time taken in the construction of a power-limiter of this kind.

Figure 4:
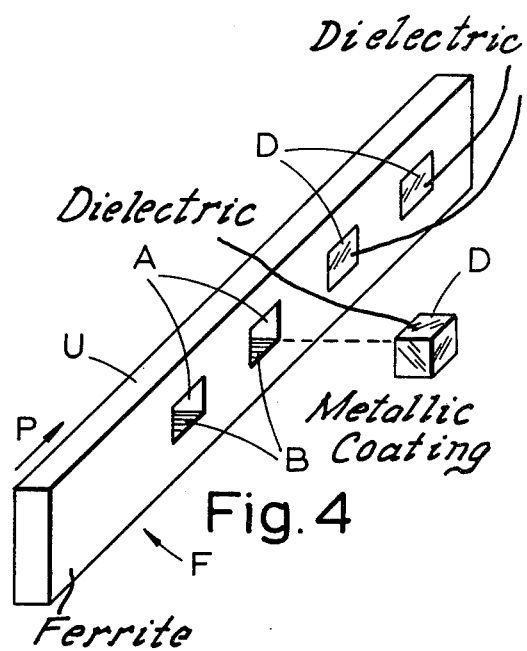

Turning now to FIG. 4 this illustrates a very simplified embodiment of the invention. The device F is a block of ferrite material in which are provided recesses or apertures A, in this embodiment of rectangular cross-section. Some of the apertures A are provided with inserts D of dielectric material so that the device itself is in the form of a monolithic slab of ferrite with the dielectric material accommodated therein. Suitably, the apertures A do not extend the whole length of the ferrite member and, as viewed in FIG. 4, the left hand end of the member is left unapertured. Suitably also, between this unapertured portion and the rest of the member, one or more of the apertures A is not provided with a dielectric insert D. The direction, in operation, of power flow is again indicated by the arrow P.

It can thus be seen that the slab of ferrite can be considered as providing two portions of different configuration and, as will be explained later, of different power-limiting characteristics, namely the solid portion at the input end of the slab and the apertured, dielectric-filled, portion at the output end. In FIG. 4 the apertured but unfilled portion can be regarded as a third portion, again having different power-limiting characteristics, intermediate the other two portions. FIG. 4 also illustrates a further optional feature of the invention which consists in forming a metallic coating B on those surfaces of the apertures which are parallel to the direction P of power flow. In this Figure, both the upper surfaces, not visible, and the lower surfaces of some or all apertures may be so metallized. This feature assists in reducing higher-order modes of propagation.

Figure 5:
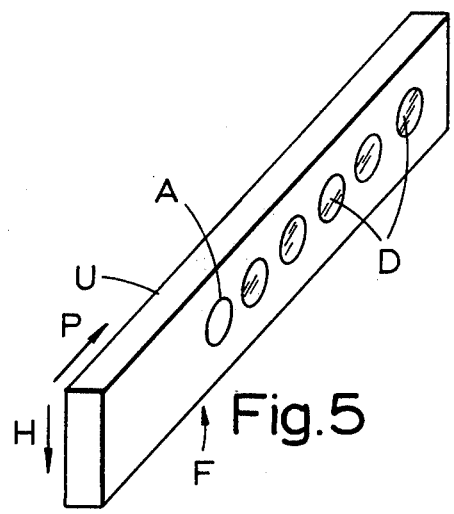

FIG. 5 illustrates an embodiment in which the apertures and dielectric inserts are of circular cross-section: here again, the end aperture A adjacent the unapertured portion is not fitted with a dielectric insert.

Figure 7:
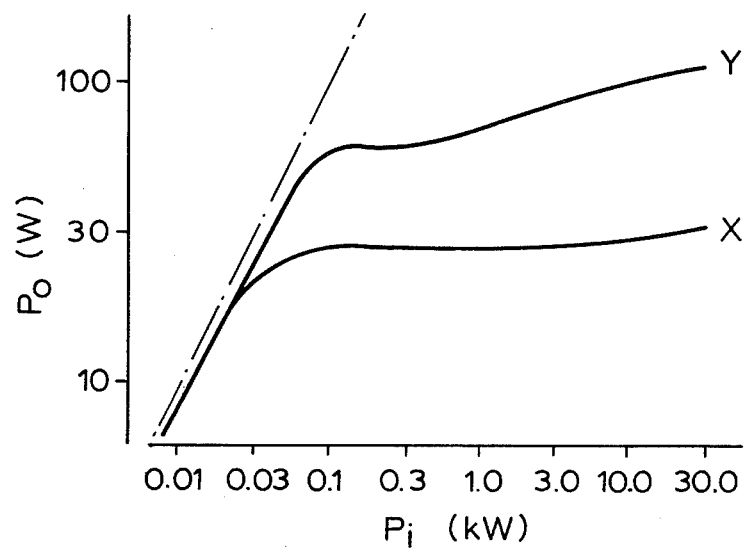
FIGS. 7 and 8 illustrate results of experiments.

In one arrangement using two slabs of the embodiment illustrated in FIG. 5 in an assembly as illustrated in FIG. 2, each slab was of polycrystalline lithium spinel ferrite type 3-2002 made by Ampex Inc. (a United States company) and was 1.875 inches long, 0.4 inches high and 0.1 inches thick: the two slabs were fitted inside a standard X band waveguide WG 16 (USA type WR90) having an inside dimension of 0.9×0.4 inches. The dielectric inserts D were formed of short lengths of type K12 "STYCAST" material made by Emerson and Cuming (a U.S. company) of 0.125 inches diameter and 0.1 inches long which fitted snugly within the apertures A. These apertures were spaced 0.125 inches apart and that at the end, that is to say the upper right hand end as viewed in FIG. 5 was also spaced 0.125 inches from the end of the ferrite slab, the apertures being centred along the central line of the slab so as to be equally distant from the upper and lower faces of the slab. The magnetic field strength in the gap was 1100 gauss. Results of experiments at a frequency of 9.4 GHz upon this arrangement are illustrated in FIG. 7 in which output power $P_o$ is plotted to a base of input power $P_i$. The experiments showed that with dielectric inserts in all the apertures A, that is to say six inserts in each slab, the arrangements limited at about 30 watts output power as shown by curve X whereas with no dielectric inserts in either of the slabs the limiting output power tended to rise to 120 watts as shown by curve Y. These and other experiments illustrate an interesting property of composite ferrite/dielectric limiters: this is that the level of limiting varies considerably with the configuration and arrangement of dielectric and ferrite parts.

In another experiment, it was found that with two apertured ferrite slabs having the apertures filled with dielectric and of the general configuration described with reference to FIG. 5, and arranged as illustrated in FIG. 2, the arrangement started to limit at a power level of the order of 30 watts. When the dielectric inserts were removed, then the apertured slab started to limit at powers of the order of some 300 watts while with an unapertured slab of the same dimensions limiting did not start until much higher powers at around 3 kilowatts. It is of course well known, and indeed is obvious, that a power limiter of this kind can only absorb a certain amount of power. If more power is applied to this device than it is able to absorb then not only does it fail to absorb the increase in power but it also becomes less efficient at absorbing even a portion of that input power so that the net output power level asymptotically approaches the input power level. Thus, the invention can provide an arrangement where, by varying the configuration of ferrite and dielectric along the slab, portions of different limiting action can be combined in a single monolithic device. Thus, the lower left hand portion of the slab of FIG. 5 operates at high power levels, typically between 3 and 30 kilowatts, the portion containing the unfilled aperture or apertures operates at a medium power level, typically between 300 watts and 3 kW while the end portion containing the dielectric-filled apertures operates at a low power level typically between 30 and 300 watts. Thus, these embodiments of the invention can be seen to offer a substantial advantage compared, for example, with the arrangement described in the above-mentioned United States patent wherein FIGS. 3 and 5 clearly show this failure of limiting action in the region of 10 kilowatts input power. It will of course be realized that in the embodiments illustrated in FIGS. 4 and 5, the input end is the lower left hand end. That is, in the complete limiter arrangement as illustrated in FIGS. 1 or 2, the direction of power flow is in the direction of arrow P and is from the bottom left hand end of the ferrite member shown in FIGS. 4 and 5 to the output at the top right hand end of those last two Figures.

FIG. 6 illustrates a further embodiment in which the ferrite slab F, of the same type as before, has apertures in the form of notches or grooves in its upper and lower faces so as to provide a castellated formation. Some of these notches are filled with dielectric material D while the two notches nearer the unapertured part of the ferrite slab are, in an analogous manner to the arrangements of FIGS. 4 and 5, left unfilled. It will of course be understood that more than one pair of notches can thus be left unfilled or, if desired, all notches can be filled. The dielectric inserts D may be in the form of separate blocks of material which are fitted snugly into the notches as is the case in the embodiments illustrated in FIGS. 4 and 5 and where this is the case then the method of making the complete device is, conveniently, to mill, grind or drill the slab so as to provide the apertures A and then to insert the dielectric inserts D into such of the apertures as it may have been decided to fill. The two broad faces of the composite slab are then smoothed down, if necessary, so that each face presents a flush surface apart of course from that portion where there are any unfilled apertures. The slab is then metallized on the surface indicated at I in FIG. 3 and, if desired, also on surfaces U and L, and is then fitted into the waveguide and secured therein by means of solder so that a secure thermal, mechanical and electrical contact is maintained between the surface I of the slab, and if desired also the surfaces U and L, which is or are in contact with the waveguide walls and the respective portions of those walls.

In a further embodiment, again using the configuration of FIG. 6, instead of using solid dielectric inserts which are fitted within the apertures A of the slab, it is convenient, having made the apertures in the slab, then to metallize the inner wide face only of the slab and then solder it into the waveguide. The selected apertures A can then be filled by a castable dielectric which preferably is of a type that bonds to metal so that the dielectric can form a firm bond not only with the appropriate parts of the narrow wall of the waveguide but also with the portions near to the slab of the wide walls of the guide. This means that it is no longer necessary accurately to dimension the cross-section of the apertures and of the dielectric inserts, which can be a great advantage: nor need the height of the slab as seen in FIG. 6 be equal exactly the height of the waveguide, because any gap GA left in between the slab and the ends of the wide walls can be filled with dielectric thus removing the large variation of dielectric constant across the guide which causes spark-over as has been remarked upon above. Where such a castable dielectric is used it also, by bonding firmly to both the waveguide wall and the ferrite slab, serves additionally to secure the slab mechanically in position within the waveguide section. In each of the two last embodiments described with reference to FIG. 6 the bottoms of the notches, that is to say the notch surfaces which are parallel to the direction of power flow, can be metallized to inhibit propagation of higher-order modes.

It should also be observed that although FIG. 6 illustrates notches of rectangular cross-section throughout the thickness of the slab, the notches may be, for example of triangular or any other suitable cross-section.

In experimental embodiments having the configuration as illustrated in FIG. 6, the slabs F were again of ferrite type 3-2002 referred to above and had the same overall dimensions of 1.875 by 0.4 by 0.1 inches. The apertures A were of square cross-section of 0.125 inches side and were the same length as the thickness of the slabs, that is to say 0.1 inches.

In one arrangement using separate inserts D, of the same dimensions as the apertures A in all the apertures the dielectric material was again K12 "STYCAST" referred to above.

In another arrangement using a castable resin the dielectric material was an epoxy resin "STYCAST" 2850 having a dielectric constant of about 7, with only five pairs of apertures in each slab filled, as is illustrated in FIG. 6.

Figure 8:
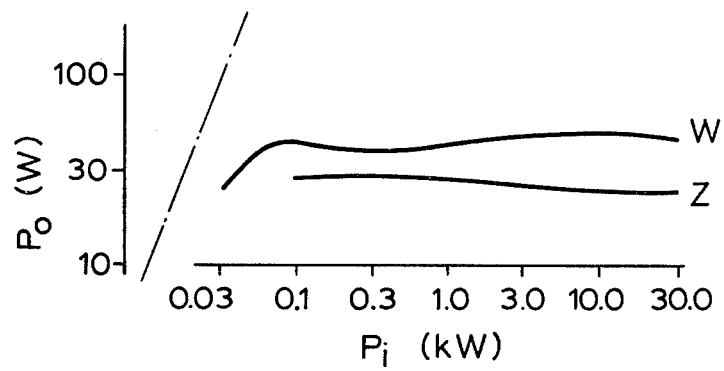

Measurements were made upon samples constructed according to these two embodiments, in all cases the field strength in the gap being 1100 gauss and the measurement frequency 9.4 GHz as before, and yielded the curves illustrated in FIG. 8, where curve W pertains to the castable dielectric embodiment and curve Z pertains to the embodiment using pre-formed inserts. In both cases the arrangement was again of the general kind illustrated in FIG. 2 and had two identical slabs opposite each other one against each narrow wall of the waveguide. The chain-dotted lines indicate the slope of a 1:1 input:output power ratio.

FIG. 9 illustrates another embodiment in which the depth of the notch-like apertures A is increased in the direction of power flow, FIG. 10 illustrates an embodiment in which the notches are of constant depth but different width, FIGS. 11 and 12 illustrate embodiments in which the apertures are formed in the central portion of the ferrite slab and not along the edges. In all these last four embodiments, one or more of the apertures nearer the high-power end of the limiter may be unfilled with dielectric.

What we claim is:

1. A microwave power limiter comprising a rectangular waveguide section having a pair of opposed wide walls and a pair of opposed narrow walls, said section further having an input port at one end for receiving a microwave signal and an output port at the other end, and a slab of ferrite material positioned in said waveguide section adjacent one of said narrow walls, said slab having at least one cavity containing a dielectric, non-magnetic material, the size of said cavity and the dielectric constant of said dielectric material being such that, upon application of a magnetic biasing field to said ferrite slab, when the power level of said signal at said input port exceeds a first value, the power level of the signal at said output port is limited to a second predetermined value which is dependent on the size of said cavity and the dielectric constant of said dielectric material.

2. The limiter according to claim 1 wherein said slab is elongated in the longitudinal direction of said waveguide section and has a plurality of said cavities spaced along the length thereof, at least some of said cavities containing inserts of solid dielectric material.

3. The limiter according to claim 2 wherein said slab has a generally rectangular cross-section and a pair of opposed wide sides which are generally parallel to said narrow walls of said waveguide section and wherein said cavities are through holes formed in and spaced along the length of said wide sides of said slab.

4. The limiter according to claim 3 wherein said cavities and said inserts have a circular cross-section.

5. The limiter according to claim 3 wherein said cavities and said inserts have a rectangular cross-section.

6. The limiter according to claim 2 wherein said cavities are notches formed in the edge of said slab and said dielectric inserts have a cross-section corresponding to the cross-section of and are arranged in said notches.

7. The limiter according to any of the preceeding claims wherein said insert is made of a castable dielectric material.

8. The limiter according to claim 7 wherein a wall surface which is parallel to the direction of power flow in said waveguide section of at least one of said cavities is metallized.

9. The limiter according to claim 2 wherein a first portion of said slab adjacent said input port is adapted to absorb power at a first power level and a second portion of said slab adjacent said output port is adapted to absorb power at a second power level lower than said first power level.

10. The limiter according to claim 9 wherein said slab has a third portion intermediate said first and second portions which is adapted to absorb power at a power level intermediate said first and second levels.

11. The limiter according to claim 2 wherein the cross-section of said cavities and the volume of said dielectric inserts in the respective cavities increase with distance along the length of said slab from the end thereof adjacent said input port to the end adjacent said output port so that the portion of said slab adjacent said input port is operative to absorb power at a power level higher than the portion of said slab adjacent said output port.

12. A method of making a microwave power limiter adapted to operate with a magnetic biasing field, said method comprising the steps of providing a plurality of cavities in a slab of ferrite adapted for insertion between the wide walls of a rectangular waveguide section having an input and an output port, metallizing the surfaces of the slab which, when said slab is inserted into the waveguide, will be in contact with the waveguide walls, inserting dielectric material into said cavities, inserting said slab into said waveguide section between said wide walls and securing said slab in said section so that there is metal to metal contact between said metallized surfaces and the adjoining walls of said waveguide, the size of said cavities and the dielectric constant of said dielectric material being such that when the power level of a microwave signal applied to said input port exceeds a first predetermined value, the power level of the signal at said output port is limited to a second value which is dependent on the size of said cavities and the dielectric constant of said material.

13. The method according to claim 12 wherein said metallizing step is carried out after insertion of said dielectric material into said cavities.

14. The method according to claim 12 wherein said step of inserting said dielectric material includes the steps of filling said cavities with a castable dielectric material and hardening said dielectric material.

15. The method according to claim 14 wherein said filling step is carried out after said slab is positioned in said waveguide section.

* * * * *